(12) United States Patent
Groeneweg

(10) Patent No.: US 6,545,620 B2
(45) Date of Patent: Apr. 8, 2003

(54) CURRENT-TO-VOLTAGE CONVERTER WITH CONTROLLABLE GAIN, AND SIGNAL PROCESSING CIRCUIT COMPRISING SUCH A CONVERTER

(75) Inventor: Willem Hendrik Groeneweg, Muri (CH)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/781,487

(22) Filed: Feb. 12, 2001

(65) Prior Publication Data
US 2001/0033241 A1 Oct. 25, 2001

(30) Foreign Application Priority Data
Feb. 14, 2000 (EP) .............................. 00200468

(51) Int. Cl.[7] .......................... H03M 1/62; H03M 1/84; H03M 1/88
(52) U.S. Cl. .................. 341/139; 341/118; 341/143; 327/103; 327/561; 330/86; 330/260; 330/278; 330/293
(58) Field of Search .................. 341/118, 143, 341/139; 327/103, 561; 330/86, 260, 278, 293

(56) References Cited

U.S. PATENT DOCUMENTS

| | | | | |
|---|---|---|---|---|
| 2,889,409 A | * | 6/1959 | Carbrey | 179/15.6 |
| 3,366,947 A | * | 1/1968 | Kawashima | 340/347 |
| 3,882,484 A | * | 5/1975 | Brokaw et al. | |
| 4,020,485 A | * | 4/1977 | Busby | 341/138 |
| 4,354,159 A | * | 10/1982 | Schorr et al. | 330/86 |
| 4,363,024 A | * | 12/1982 | Brokaw | 341/127 |
| 4,500,845 A | * | 2/1985 | Ehni | 330/86 |
| 4,544,912 A | * | 10/1985 | Iwamoto | 340/347 |
| 4,628,276 A | * | 12/1986 | Mizutani | 330/86 |
| 4,669,877 A | * | 6/1987 | Wittmer | 356/300 |
| 4,947,172 A | * | 8/1990 | Suzuki | 341/118 |
| 5,307,065 A | * | 4/1994 | Tokuhiro | 341/153 |
| 5,323,157 A | * | 6/1994 | Ledzius et al. | 341/136 |
| 5,486,791 A | * | 1/1996 | Spitalny et al. | 330/282 |
| 5,640,163 A | * | 6/1997 | Nauta et al. | 341/155 |
| 5,969,658 A | * | 10/1999 | Naylor | 341/154 |
| 5,995,030 A | * | 11/1999 | Cabler | 341/143 |
| 6,147,558 A | * | 11/2000 | Sculley | 330/284 |

* cited by examiner

Primary Examiner—Michael Tokar
Assistant Examiner—Khai Nguyen
(74) Attorney, Agent, or Firm—Aaron Waxler

(57) ABSTRACT

Summarizing, the present invention provides an IVC (100), comprising an operational amplifier (110) with an inverting input (112) and an output (113), and a feedback resistor ladder network (120) coupled between the output (113) and the inverting input (112). The feedback resistor ladder network (120) comprises a main chain (121) composed of a plurality of substantially identical unit resistors (RU) connected in series, and a plurality of branches (124$_i$), each branch (124$_i$) coupling a node ($X_i$) in the main chain (121) to the inverting input (112) of the operational amplifier (110), each branch (124$_i$) comprising a selectable feedback switch (123$_i$). Further, some of the branches (124$_i$) comprise a non-unit resistor ($RNU_i$) coupled in series with the corresponding selectable feedback switch (123$_i$).

Further, the present invention provides a circuit comprising a FIRDAC (20) and a bias block (30) for providing at least one bias current for the FIRDAC (20). The bias block (30) comprises at least one bias resistor (RB). The FIRDAC (20) is associated with at least one IVC (25, 26), configured as described above, wherein the unit resistors (RU) of the at least one IVC (25, 26) are substantially identical to the bias resistor (RB) of the bias block (30).

12 Claims, 8 Drawing Sheets

CURRENT-TO-VOLTAGE CONVERTER WITH CONTROLLABLE GAIN, AND SIGNAL PROCESSING CIRCUIT COMPRISING SUCH A CONVERTER

BACKGROUND OF THE INVENTION

The present invention relates in general to a current-to-voltage converter with controllable gain, hereinafter referred to as IVC. More particularly, the present invention relates to an IVC suitable for use in a finite impulse response digital-to-analog converter (hereinafter referred to as FIRDAC), as well as to a FIRDAC provided with such an IVC, and the present invention will be explained in the following for this particular example. It is, however, to be noted that the present invention is not limited to the use in a FIRDAC.

The finite impulse response principle for a digital-to-analog converter is known per se, and described for instance in U.S. Pat. No. 5,323,157. Generally speaking, a FIRDAC comprises a shift register with a large number of stages, typically more than hundred stages, which receives a bitstream input signal of one bit, i.e. a serial data stream with one bit amplitude resolution. Each of the stages of the shift register switches a dedicated current source ON or OFF. The currents thus generated by all of the stages of the shift register are added to generate an output current of the FIRDAC. Usually, the output current is applied to a current-to-voltage converter to generate an analog output voltage of the FIRDAC. Each stage of the FIRDAC produces an output current contributing to the overall output current of the FIRDAC. However, the stages of the FIRDAC do not all contribute in the same extent. In order to obtain a desired filter characteristic, each stage of the FIRDAC has an associated weighting coefficient, which is constituted by the magnitude of the output current of the current source.

In a typical application situation, the FIRDAC is used in a signal-processing path of a mobile telephone for providing an analog audio signal to a speaker or earphone.

Said dedicated current sources of the FIRDAC receive a reference current from a bias block, which comprises a stable reference voltage source and a bias resistor. Further, said current-to-voltage converter (IVC) of the FIRDAC comprises an operational amplifier and a feedback resistor. It is desirable that said bias resistor of the bias block and said feedback resistor of said IVC match very well, because the better the matching between said two resistors, the better the gain stability of the FIRDAC.

Further, it is desirable that the said feedback resistor of the IVC and said bias resistor of the bias block are built from the same type of resistors, because then the stability of the voltage output of the IVC is related to the stability of said reference voltage and the absolute value of the resistors is not important.

In principle, the above mentioned requirements are relatively easy to meet on one single chip by constructing each of said resistors as a series connection of a predetermined plurality of unit resistors which are mutually substantially identical.

However, it is further desirable that the gain of the IVC is programmable or controllable in steps of 3 dB. In designing a current-to-voltage converter, or an amplifier, with a controllable gain, it is known per se to use a feedback ladder resistor network comprising a plurality of resistors and a plurality of controllable switches, wherein the feedback resistor value is controlled by selecting a switch. However, in such a setup it is not possible to combine the requirement of substantially identical unit resistors with the requirement of gain steps of 3 dB. In previous designs, the requirement of using unit resistors has been dropped. In such previous design, the feedback resistor ladder comprises a series connection of resistors, at least one of those series resistors being a non-unit resistor. For obtaining a resistor device having a resistance value similar to a unit resistor, a further non-unit resistor is used, such that the combination of the resistor values of the first mentioned non-unit resistor and the further non-unit resistor is approximately equal to the resistance value of a unit resistor. As a consequence, for each selected switch a feedback loop is established which comprises at least two non-matching resistors.

SUMMARY OF THE INVENTION

The present invention aims to overcome or at least alleviate said problems. More particularly, it is an objective of the present invention to provide a current-to-voltage converter with a controllable gain, making use of unit resistors as much as possible in order to obtain improved matching with a bias resistor.

BRIEF DESCRIPTION OF THE DRAWING

These and other aspects, characteristics and advantages of the present invention will be further clarified by the following description of a preferred embodiment of a control circuitry in accordance with the invention, with reference to the drawings, in which same reference numerals indicate equal or similar parts, and in which.

DESCRIPTION OF THE PREFERRED EMBODIMENTS

Figure 1:
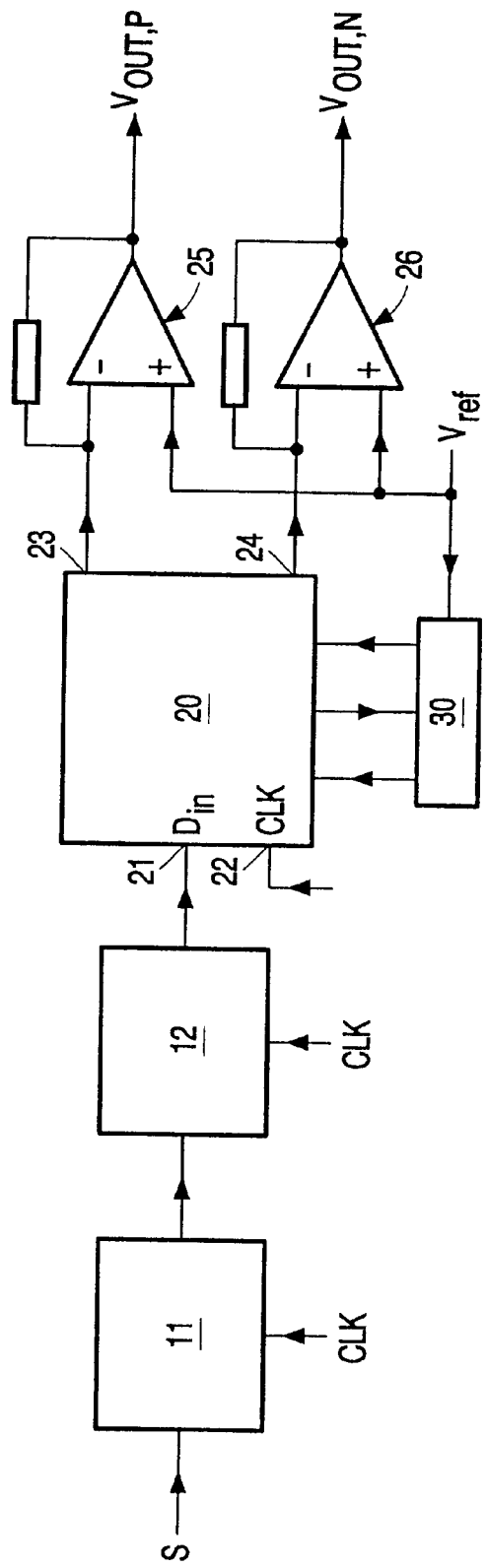
FIG. 1 shows a block diagram of an example of a circuit for processing a voice signal.

FIG. 1 shows a block diagram of a possible circuit for processing a voice signal S in a mobile telephone. The circuit comprises a digital filter 11 and a noise-shaper or bitstream generator 12, both of which may be of conventional design, for which reason they will not be described in more detail here. The digital filter 11 is arranged for suppressing frequencies outside the voice band, i.e. below 300 Hz and above 3400 Hz. The digital filter 11 has an output connected to an input of the noise-shaper 12, which is arranged for providing a resulting 1 MHz bitstream (1-bit) signal at its output, which is connected to a signal input 21 of a FIRDAC 20. A bias block 30 receives a reference voltage such as a bandgap voltage $V_{ref}$, and is coupled to the FIRDAC for providing a number of bias currents.

The FIRDAC 20 has a clock input 22 for receiving a clock input signal CLK. Similarly, the digital filter 11 and the noise-shaper 12 have clock input terminals for receiving a clock signal CLK which may or may not be identical to the clock signal for the FIRDAC. The frequency of the clock signal CLK for the FIRDAC 20 depends, inter alia, on the desired signal-to-noise ratio and the frequencies available in the system. For instance, in a GSM system, the frequency of the clock signal may be 1 MHz, which can easily be derived from a GSM master clock frequency of 13.0 MHz.

It is possible to have a FIRDAC with only one output line. However, the FIRDAC 20 of the present invention provides for differential drive in that it has two current output terminals 23 and 24, for generating a positive current and a negative current, respectively, depending whether the bitstream signal contains mainly ones (corresponding to the positive half of the voiceband signal) or mainly zeroes (corresponding to the negative half of the voiceband signal), respectively. The said current signals are fed to current-to-voltage converters 25 and 26, respectively, which generate output voltage signals $V_{OUT,P}$ and $V_{OUT,N}$, respectively, to be fed to output stages such as earphone drivers (not shown).

Figure 2A:
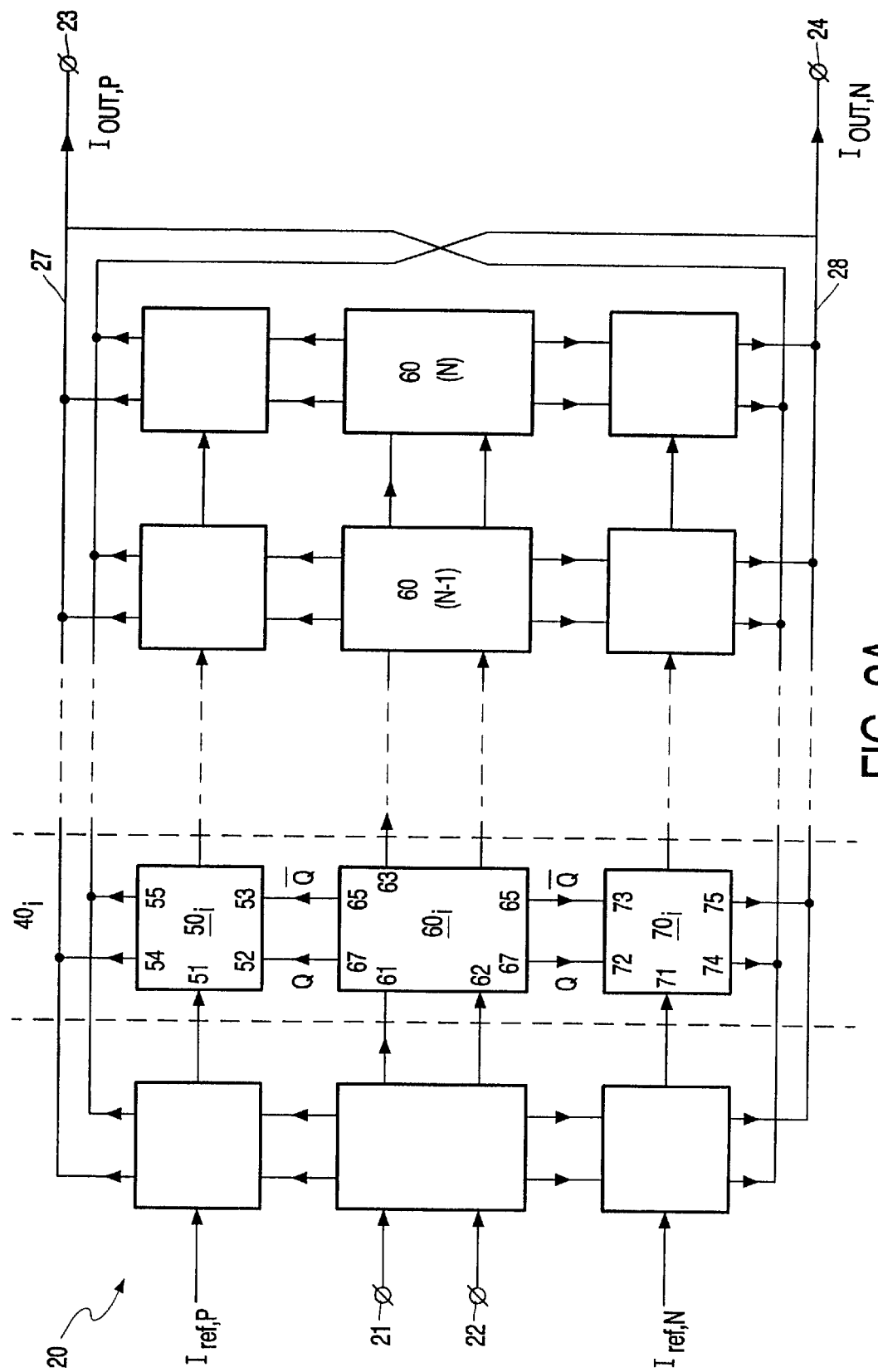
FIG. 2A shows a block diagram of a FIRDAC.

FIG. 2A schematically illustrates a partial internal block diagram of the FIRDAC 20.

Hereinafter, identical elements of the FIRDAC circuit 20 will be indicated by identical reference numerals, while a subscript i refers to the position of such element in the FIRDAC circuit. For the sake of simplicity, these subscripts are not indicated in the drawings for all components. Each FIRDAC cell $40_i$ comprises a PMOS current source $50_i$, a shift register cell $60_i$, and an NMOS current sink $70_i$.

Each PMOS current source $50_i$ has a reference current input $51_i$ for receiving a reference current $I_{ref,P}$, first and second binary control inputs $52_i$ and $53_i$ for receiving binary control signals, and first and second current output terminals $54_i$ and $55_i$ for providing a positive output current $I_{Pi}$.

Similarly, each NMOS current sink $70_i$ comprises an input $71_i$, first and second control inputs $72_i$ and $73_i$, and first and second current outputs $74_i$ and $75_i$.

Each shift register cell $60_i$ is constituted by a D-type flipflop, and comprises a Q-output $67_i$ and a $\overline{Q}$-output $65_i$. The Q-output $67_i$ is coupled to the first binary control input $52_i$ of the corresponding PMOS current source $50_i$ and to the first binary control input $72_i$ of the corresponding NMOS current sink $70_i$. The $\overline{Q}$-output $65_i$ is coupled to the second binary control input $53_i$ of the corresponding PMOS current source $50_i$ and to the second binary control input $73_i$ of the corresponding NMOS current sink $70_i$.

Each D-type flipflop $60_i$ has a signal input $61_i$ and a signal output $63_i$. The signal input $61_i$ is connected to the signal output $63_{i-1}$ of the previous flipflop $60_{i-1}$. The signal input $61_1$ of the first flipflop $60_1$ is connected to the input terminal 21 of the FIRDAC 20. Further, each D-type flipflop $60_i$ has a clock input $62_i$ connected to the clock input terminal 22 of the FIRDAC 20. At a rate determined by the frequency of the clock signal applied to the clock input 22 of the FIRDAC 20, typically 1 MHz, the bitstream signal is shifted into the shift register. At each moment in time, a flipflop state corresponds to the value of a bit in the bitstream signal. If a bit has a value "1", the Q-output 67 of the corresponding flipflop 60 is HIGH and the $\overline{Q}$-output 65 of this flipflop is LOW: in this situation, the corresponding PMOS current source 50 is coupled to a positive current output line 27 while the corresponding NMOS current sink 70 is coupled to a negative current output line 28. Otherwise, if a bit has a value "0", the Q-output 67 of the corresponding flipflop 60 is LOW while the $\overline{Q}$-output 65 of this flipflop is HIGH; in this situation, the PMOS current source 50 is coupled to the negative current output line 28 while the NMOS current sink 70 is coupled to the positive current output line 27. The positive current output line 27 is connected to the positive current output terminal 23, whereas the negative current output line 28 is connected to the negative current output terminal 24.

At the positive output 23 of the FIRDAC 20, the positive output signal $I_{OUT,P}$ is the summation of all output currents $I_{Pi}$ of those PMOS current sources $50_i$ that are coupled to the positive current output line 27 and of all output currents $I_{Ni}$ of those NMOS current sources $70_i$ that are coupled to the positive current output line 27. Similarly, at the negative current output 24, the negative output current $I_{OUT,N}$ is the summation of all output currents $I_{Ni}$ of those NMOS current sinks $70_i$ that are coupled to the negative current output line 28 and of all output currents $I_{Pi}$ of those PMOS current sources $50_i$ that are coupled to the negative current output line 28. Thus, the positive and negative output currents $I_{OUT,P}$ and $I_{OUT,N}$ depend on the portion of the bitstream signal currently present in the shift register, each bit corresponding to a positive or negative current contribution, whereas the total output current $I_{OUT,P}+I_{OUT,N}$ remains constant.

However, the current contributions of different current sources or current sinks, respectively, differ from each other, embodying the weighting coefficient of the different FIRDAC stages, which are selected to obtain a desired response characteristic of the FIRDAC, as will be clear to a person skilled in the art. Typically, the coefficients are symmetrical around the center stage, the cells located near the input side or near the output side of the FIRDAC 20 contributing with a relatively small output current, and the cells located near the center of the FIRDAC 20 contributing with a relatively high output current. For each cell, $40_i$, the magnitude of the output currents $I_{Pi}$ and $I_{Ni}$ generated by the PMOS current sources $50_i$ and the NMOS current sink $70_i$, respectively, is determined by the width of the PMOS current source $50_i$ and the NMOS current source $70_i$, respectively. The larger the current source or current sink, the larger the current generated.

Figure 2B:
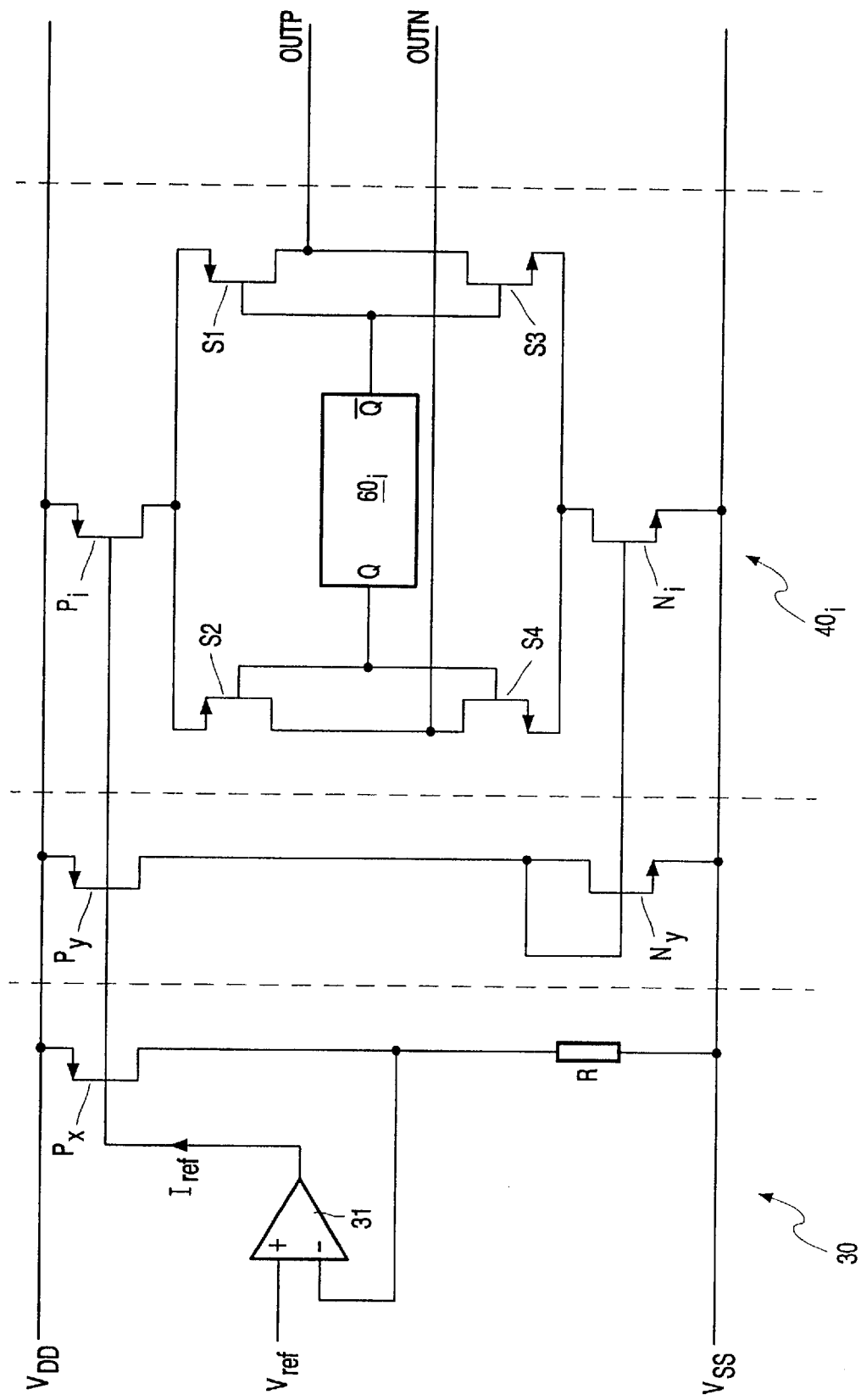
FIG. 2B shows a circuit diagram of an embodiment of the invention.

FIG. 2B illustrates more details of a possible embodiment of the bias block 30 and the FIRDAC 20. It is noted that in FIG. 2B, only one FIRDAC cell $40_i$ is shown, but all FIRDAC cells have a similar build-up, as will be clear to a person skilled in the art. In each FIRDAC cell $40_i$, the PMOS current source $50_i$ comprises a P-transistor $P_i$ whereas the NMOS current source $70_i$ comprises an N-transistor $N_i$, these two transistors having their gates coupled to receive a bias reference current from the bias circuit 30. The bias circuit 30 comprises an amplifier 31 receiving a reference voltage $V_{ref}$ at its non-inverting input, and having its output coupled to the gate of a P-transistor $P_X$. The source of the P-transistor $P_X$ is connected to a supply line $V_{DD}$, and the drain of the P-transistor $P_X$ is connected to one terminal of a bias resistor means RB, while the other terminal of the bias resistor means RB is connected to a second supply voltage $V_{SS}$. As usually, the voltage level of the second voltage supply line $V_{SS}$ is lower than the voltage level of the first voltage supply line $V_{SS}$, and normally at ground level. The node between the drain of the P-transistor $P_X$ and the bias resistor means RB is connected to the inverting input of the amplifier 31.

The bias circuit 30 further comprises a second P-transistor $P_Y$ having its source connected to the first supply line $V_{DD}$ and its gate connected to the gate of the P-transistor $P_X$, and an N-transistor $N_Y$ having its source connected to the second supply line $V_{SS}$ and having its gate and its drain connected to the drain of the P-transistor $P_Y$.

The reference voltage $V_{ref}$ may be provided by a stable band gap source. The bias resistor means RB may for instance be implemented as a MOS transistor set to behave as a resistor, or as an on-chip resistor of poly-silicon material.

Each FIRDAC cell $40_i$ comprises, as mentioned, a shift register cell $60_i$, constituted by a D-type flipflop, and comprises a Q-output and a $\overline{Q}$-output.

In each FIRDAC cell $40_i$, the P-transistor $P_i$ has its source coupled to the first supply line $V_{DD}$ and has its gate coupled to the gate of said P-transistor $P_Y$. Further, in each FIRDAC cell $40_i$, the N-transistor Ni has its source connected to the second supply line $V_{SS}$ and has its gate connected to the gate of said N-transistor $N_Y$. The drain of the P-transistor $P_i$ of the FIRDAC cell $40_i$ is coupled to a positive output line OUTP through a first switch S1, and is coupled to a negative output line OUTN through a second switch S2. Similarly, the drain of the N-transistor $N_i$ of the FIRDAC cell $40_i$ is coupled to the positive output line OUTP through a third switch S3, and is coupled to the negative output line OUTN through a fourth switch S4.

The first and third switches S1 and S3 are controlled by the inverted output $\overline{Q}$ 65 of the flipflop 60, and the second and fourth switches S2 and S4 are controlled by the output Q 67 of the flipflop 60. More particularly, the first switch S1 is implemented as a P-transistor having its source connected to the drain of transistor $P_i$, having its drain connected to the positive output line OUTP, and having its gate connected to the inverted output $\overline{Q}$ of the flipflop 60. The second switch S2 is implemented as a P-transistor having its source connected to the drain of transistor $P_i$, having its drain connected to the negative output line OUTN, and having its gate connected to output Q of the flipflop 60. The third transistor S3 is implemented as an N-transistor having its source connected to the drain of transistor $N_i$, having its drain connected to the positive output line OUTP, and having its gate connected to the inverted output $\overline{Q}$ of flipflop 60. The fourth switch S4 is implemented as an N-transistor having its source connected to the drain of transistor $N_i$, having its drain connected to the negative output line OUTN, and having its gate connected to the output Q of flipflop 60.

As an alternative with improved current accuracy with respect to clock feedthrough and supply tolerances, the P-switches S1 and S2 might be coupled to the output lines OUTP and OUTN, respectively, by respective P-type cascode transistors (not shown), while the N-switches S3 and S4 might be coupled to the output lines OUTP and OUTN, respectively, by respective N-type cascode transistors (not shown), wherein the gates of such cascode transistors are supplied by a stable bias voltage.

All FIRDAC cells $40_i$ are coupled to the positive and negative output lines OUTP and OUTN, respectively, in a similar manner.

If the flipflop 60 contains a bit value "1", output Q is HIGH and output $\overline{Q}$ is LOW. In this situation, the switches S1 and S4 are conducting, while the switches S2 and S3 are non-conductive. Thus, the positive output line OUTP is connected through switch S1 to the drain of transistor $P_i$, and this transistor $P_i$, acting as current source, delivers its output current to positive output line OUTP. Similarly, in this situation the negative output line OUTN is connected to the transistor $N_i$ through switch S4, this transistor $N_i$ acting as current sink for output line OUTN.

If the flipflop 60 contains a bit value "0", the output Q is LOW and the output $\overline{Q}$ is HIGH. In this condition, the switches S2 and S3 are conductive while the switches S1 and S4 are non-conductive. Thus, the current source $P_i$ is now connected to the negative output line OUTN while the current sink $N_i$ is connected to positive output line OUTP.

It is noted that a FIRDAC with only one output line, wherein the current source $P_i$ and the current sink $N_i$ are both connected to such one output line, is possible. However, the FIRDAC 20 of the present invention provides two output signals on the two output lines OUTP and OUTN, more particularly a positive output signal on the positive output line OUTP and a negative output signal on the negative output line OUTN, in order to provide for differential drive.

Figure 3:
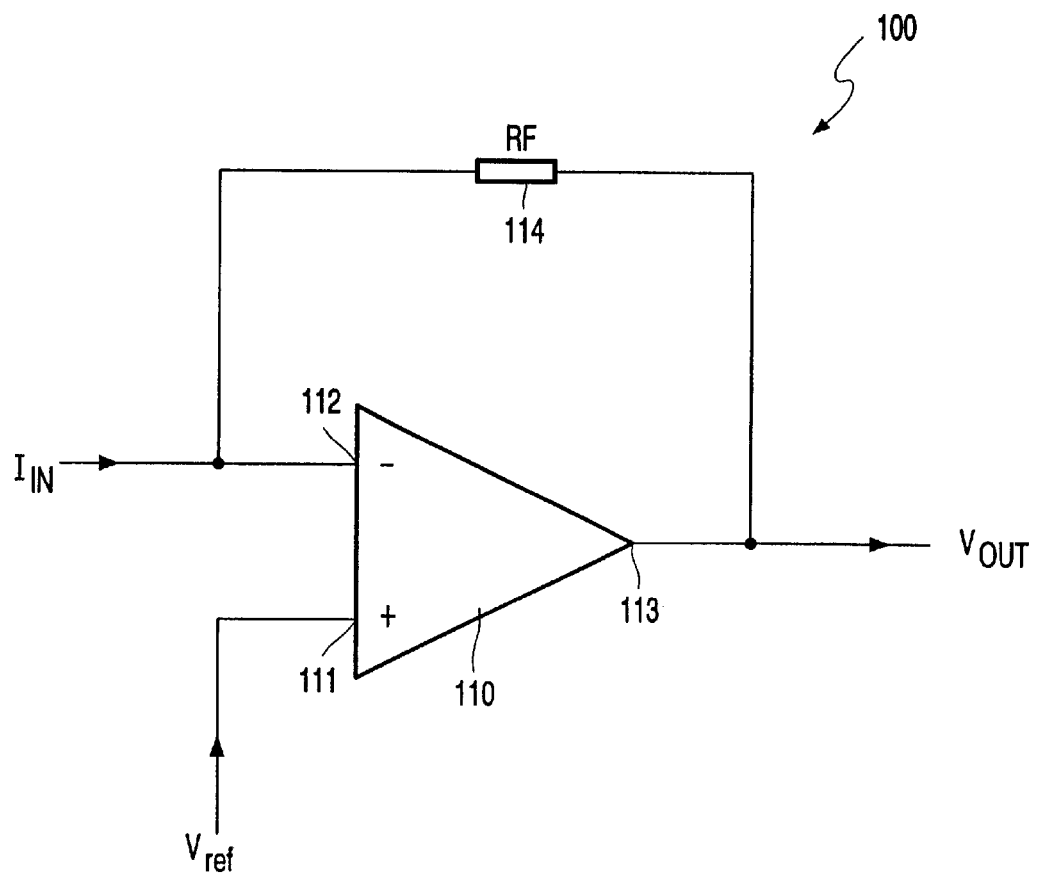
FIG. 3 is a circuit diagram illustrating the principle of a current-to-voltage converter.

FIG. 3 illustrates the principle of a current-to-voltage converter (IVC), such as used for the converters 25 and 26 discussed above with reference to FIG. 1. In FIG. 3, an IVC is generally indicated at 100, and comprises an operational amplifier 110 having a non-inverting input 111, an inverting input 112, and an output 113. The non-inverting input 111 is coupled to receive a reference voltage $V_{ref}$. The output 113 is connected to the inverting input 112 by means of a feedback resistor means 114 having a resistance value RF. As will be clear to persons skilled in the art, the operational amplifier 110 will provide an output voltage $V_{out}$ at its output terminal 113 fulfilling the equation $$V_{out} = -I_{in} \cdot RF + V_{ref}$$

wherein $I_{in}$ is an input current received at the inverting input 112. Thus, the IVC 100 of FIG. 3 will have a gain, defined as MV/MI, equal to the resistance value RF of the feedback resistor means 114.

In general, it is desirable that the gain of the IVC 110 is adjustable in equal steps. As will be clear to a person skilled in the art, this can be achieved by using different values of the feedback resistor means 114, wherein the subsequent values of the feedback resistance differ by a constant factor. Hereinafter, an example will be discussed where said equal steps are approximately 3 dB; herein, the subsequent values of the feedback resistance differ by a factor of approximately 4.4125.

Figure 4A:
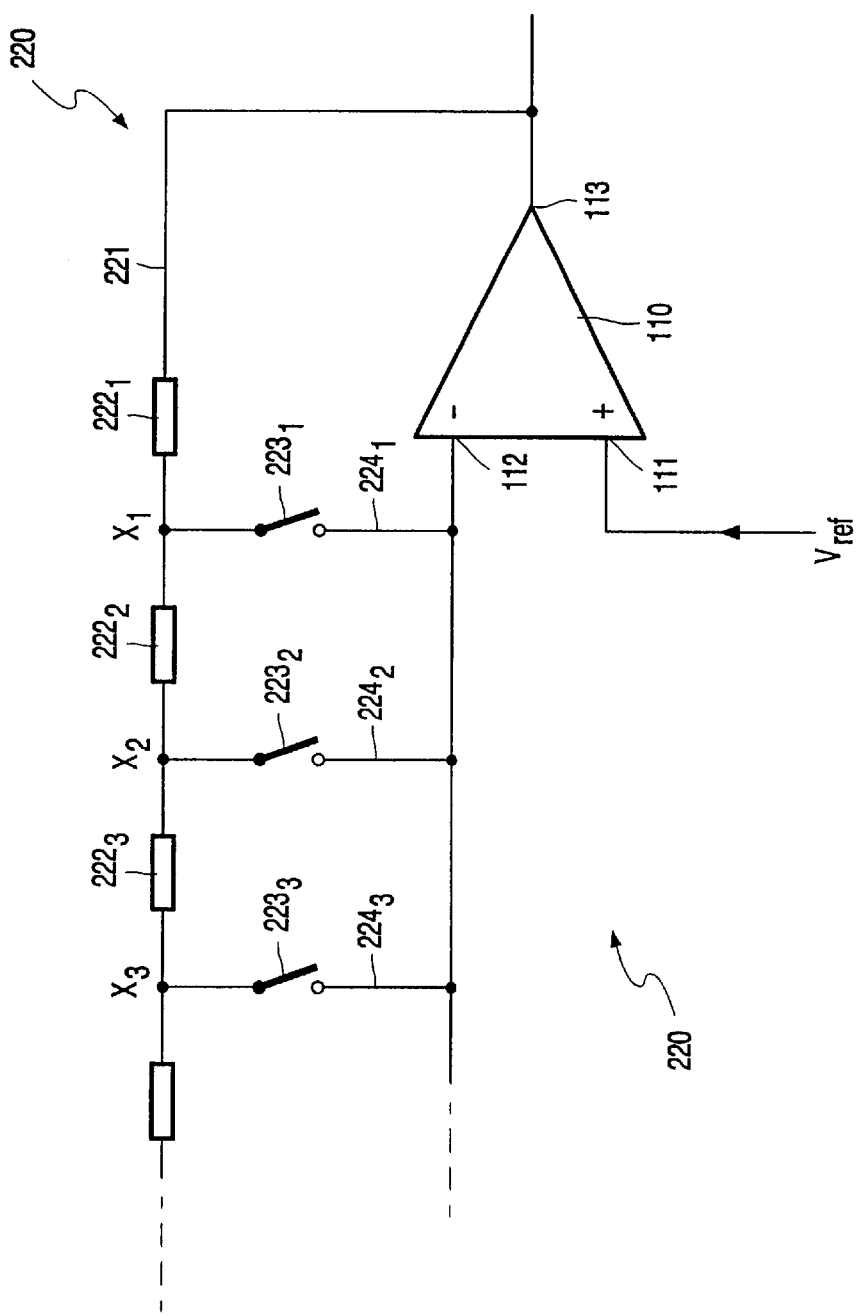
FIGS. 4A–B are circuit diagrams illustrating a prior art feedback resistor ladder network for obtaining a controllable gain.

FIG. 4A illustrates a prior art IVC 200, in which the feedback resistor means is implemented as a "ladder" network 220, comprising a main chain 221 of feedback resistor means $222_i$ coupled in series, one end of this main chain 221 being connected to the output 113 of the opamp 110. Each node $X_i$ between subsequent resistor means $222_i$ is coupled to the inverting input 112 of the opamp 110 by means of a controllable switch $223_i$. Thus, the resistance value of the feedback loop between output 113 and inverting input 112 can be controlled by selectably closing one of said controllable switches $223_i$, the other switches remaining open. However, in such a setup, the subsequent feedback resistor means will, in principle, have different resistance values.

Hereinafter, the invention will be further explained assuming that the resistor means are implemented as "real" resistors. However, as will be clear to a person skilled in the art, the resistor means may alternatively be implemented as MOS transistors set in such a way that they behave as resistors.

In order to obtain as good a match as possible for this situation between the feedback resistor RF on the one hand and the bias resistor RB on the other hand, it is desirable that both the bias resistor RB and the feedback resistor RF are constituted from identical resistive building blocks, indicated as "unit resistors" RU. It will be evident that, in the prior art setup, the above mentioned relationship for obtaining gain steps in the order of a fixed value, such as 3 dB, can not be combined with the desire of only using unit resistors.

Figure 4B:
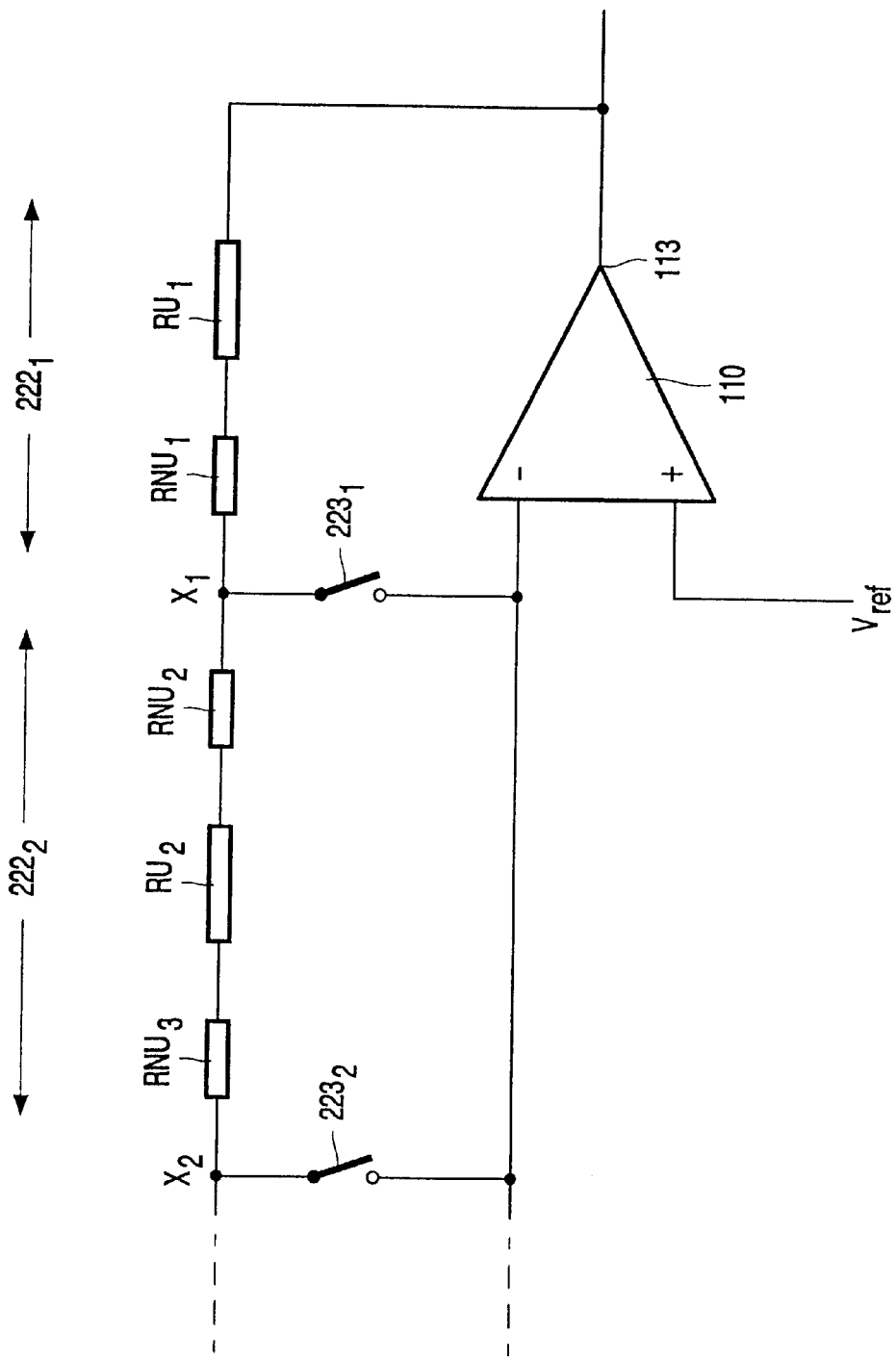

Therefore, the prior art setup involves a compromise in that as many unit resistors as possible are used, and in that the required resistance value is obtained by using additional non-unit resistors in the main chain, as illustrated in FIG. 4B. FIG. 4B shows only part of the feedback loop of FIG. 4A, more particularly showing the feedback resistor between the output 113 and the second node $X_2$.

As shown in FIG. 4B, the first feedback resistor $222_1$ is implemented as a series connection of a first unit resistor $RU_1$ and a first non-unit resistor $RNU_1$ having a resistance value of RX−RU, wherein RX is the desired resistance value of the first feedback resistor $222_1$. Then, if the first switch $223_1$ is selected, the feedback loop has the resistance value of RX.

As further shown in FIG. 4B, the second feedback resistor $222_2$ is implemented as a series connection of a second non-unit resistor $RNU_2$, a second unit resistor $RU_2$, and a third non-unit resistor $RNU_3$. The second non-unit resistor $RNU_2$ is chosen such that $RNU_1+RNU_2$ equals RU, in order to approach the situation of unit resistors connected in series as well as possible. The third non-unit resistor $RNU_3$ is chosen such that the desired resistance value of the second feedback resistor $222_2$ is obtained.

An important disadvantage of the prior art solution is that the non-unit resistors $RNU_i$ are present in the main chain, and come into play for any switch located further in the ladder circuit. In practice, one has tried to alleviate the problems caused by these non-unit resistors by trying to construct these non-unit resistors as a combination of a plurality of unit resistors connected in series and/or parallel.

According to the present invention, this problem is overcome by constituting the main chain from unit resistors only, and by using any non-unit resistors in the ladder branches between the respective nodes and the non-inverting input of the opamp, only. Thus, if a non-unit resistor is necessary in order to obtain a desired resistance value corresponding to a certain switch, such non-unit resistor only affects this specific setting. If another switch is selected, such non-unit resistor does not come into play anymore. If for instance the second switch is selected, the resistance value of the feedback loop is defined by the two (or more) unit resistors between the output and the second node in the main chain, plus, if necessary, one single non-unit resistor in the second branch, in series with the second switch.

Figure 5:
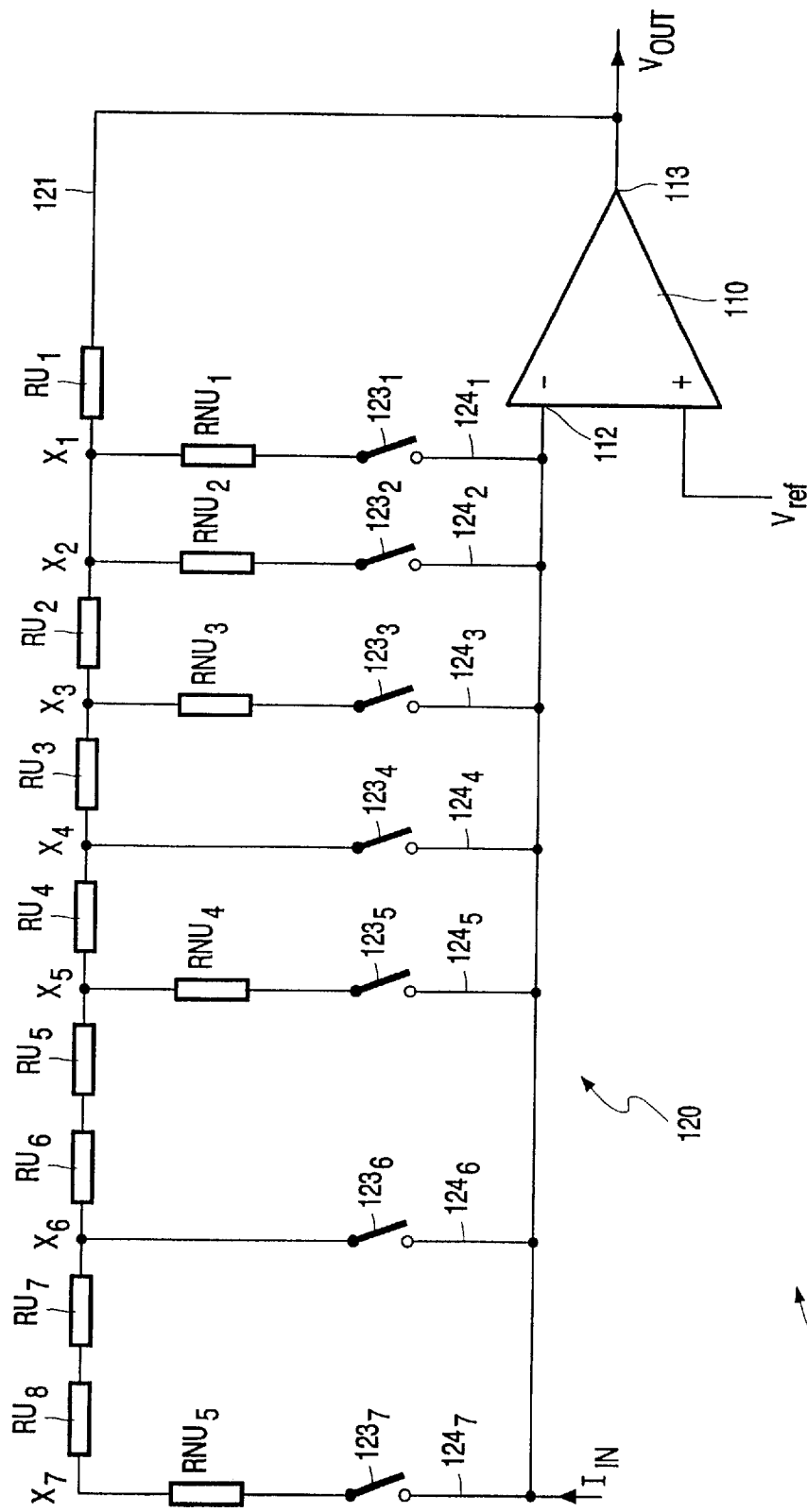
FIG. 5 is a circuit diagram illustrating an embodiment of a feedback resistor ladder network in accordance with the present invention.

FIG. 5 illustrates a possible embodiment of an IVC 100 according to the present invention. This embodiment is arranged for allowing for seven selectable or programmable gain setting between +3 dB and −15 dB in equal steps of approximately 3 dB. In accordance with the principles of the present invention, the IVC 100 has a feedback ladder network 120 comprising a main chain 121 consisting of a series connection of unit resistors RU only, in this embodiment eight unit resistors $RU_1$–$RU_8$.

The main chain 121 comprises seven nodes $X_1$–$X_7$, namely:
a first node $X_1$ between the first unit resistor $RU_1$ and the second unit resistor $RU_2$;
a second node $X_2$ between the first unit resistor $RU_1$ and the second unit resistor $RU_2$;
a third node $X_3$ between the second unit resistor $RU_2$ and the third unit resistor $RU_3$;
a fourth node $X_4$ between the third unit resistor $RU_3$ and the fourth unit resistor $RU_4$;
a fifth node $X_5$ between the fourth unit resistor $RU_4$ and the fifth unit resistor $RU_5$;
a sixth node $X_6$ between the sixth unit resistor $RU_6$ and the seventh unit resistor $RU_7$;
a seventh node $X_7$ at the free end of the eighth unit resistor $RU_8$.

The ladder network 120 further comprises seven branches $124_1$–$124_7$ connected between a corresponding node $X_i$ and the inverting input 112 of the opamp 110. Each branch $124_i$ comprises a controllable switch $123_i$. Five of said branches comprise a non-unit resistor RNU connected in series with the corresponding controllable switch $123_i$.

This ladder network 120 is developed based on the assumption that the resistance value corresponding to 0 dB is equal to N times RU, wherein N is an integer, N being equal to 6 in this embodiment. The parameters of this ladder network 120 are given in table 1. In table 1, the first column indicates the desired gain, and the second column indicates the required resistance value RF of the feedback loop, based on the assumption that each unit resistor RU has a resistance of 2000 Ohm in this embodiment. The third column indicates the switch to be selected for each desired gain. The fourth column indicates the number of unit resistors that contribute to the resistance value of the feedback loop, and the fifth column indicates the additional resistance value needed in the loop.

| GAIN   | RF (Ohm) | switch  | #  | add.res. (Ohm) |
|--------|----------|---------|----|----------------|
| +3 dB  | 16970    | $123_7$ | 8  | 970            |
| 0 dB   | 12000    | $123_6$ | 6  |                |
| −3 dB  | 8485     | $123_5$ | 4  | 485            |
| −6 dB  | 6000     | $123_4$ | 3  |                |
| −9 dB  | 4243     | $123_3$ | 2  | 243            |
| −12 dB | 3000     | $123_2$ | 1  | 1000           |
| −15 dB | 2121     | $123_1$ | 1  | 121            |

Thus, in the proposed preferred embodiment, the circuit has two gain settings wherein only unit resistors contribute to the resistance value of the feedback loop: in the setting of 0 dB (sixth switch $123_6$ selected), six unit resistors $RU_1$–$RU_6$ in the main chain 121 contribute to the resistance value of the feedback loop, whereas in the setting of −6 dB (fourth switch $123_4$ selected), three unit resistors $RU_1$–$RU_3$ in the main chain 121 contribute to the resistance value of the feedback loop.

In the +3 dB setting (seventh switch $123_7$ selected), all eight unit resistors $RU_1$–$RU_8$ in the main chain 121 contribute to the resistance value of the feedback loop, but an additional resistance of 970 Ohm is needed; this is achieved by one single non-unit resistor $RNU_5$.

In the −3 dB setting (fifth switch $123_5$ selected), four unit resistors $RU_1$–$RU_4$ in the main chain 121 contribute to the resistance value of the feedback loop, but an additional resistance of 485 Ohm is needed; this is achieved by one single non-unit resistor $RNU_4$.

In the −9 dB setting (third switch $123_3$ selected), two unit resistors $RU_1$–$RU_2$ in the main chain 121 contribute to the resistance value of the feedback loop, but an additional resistance of 243 Ohm is needed; this is achieved by one single non-unit resistor $RNU_3$.

In the −12 dB setting (second switch $123_2$ selected), one unit resistor $RU_1$ in the main chain 121 contributes to the resistance value of the feedback loop, but an additional resistance of 1000 Ohm is needed; this is achieved by one single non-unit resistor $RNU_2$. It is noted that the second additional non-unit resistor $RNU_2$ in series with the second selectable switch $123_2$ in the second branch $124_2$ has a resistance value equal to half the resistance value of a unit resistor RU; therefore, this second non-unit resistor $RNU_2$ can preferably be constituted as a parallel connection of two unit resistors, further enhancing the matching characteristics of this circuit.

In the −15 dB setting (first switch $123_1$ selected), said one unit resistor $RU_1$ in the main chain 121 contributes to the resistance value of the feedback loop, but an additional resistance of 121 Ohm is needed; this is achieved by one single non-unit resistor $RNU_1$.

Hence, in all settings, a maximum of only one non-unit resistor contributes to the resistance value of the feedback loop in each case. It is noted that such non-unit resistor only affects its own corresponding setting, due to the fact that such non-unit resistor is not incorporated in the main chain 121 but in a branch 124.

It is further noted that, if N is an integer times four, the −12 dB setting can be achieved with an integer number of unit resistors, no additional non-unit resistor being necessary.

Figure 6:
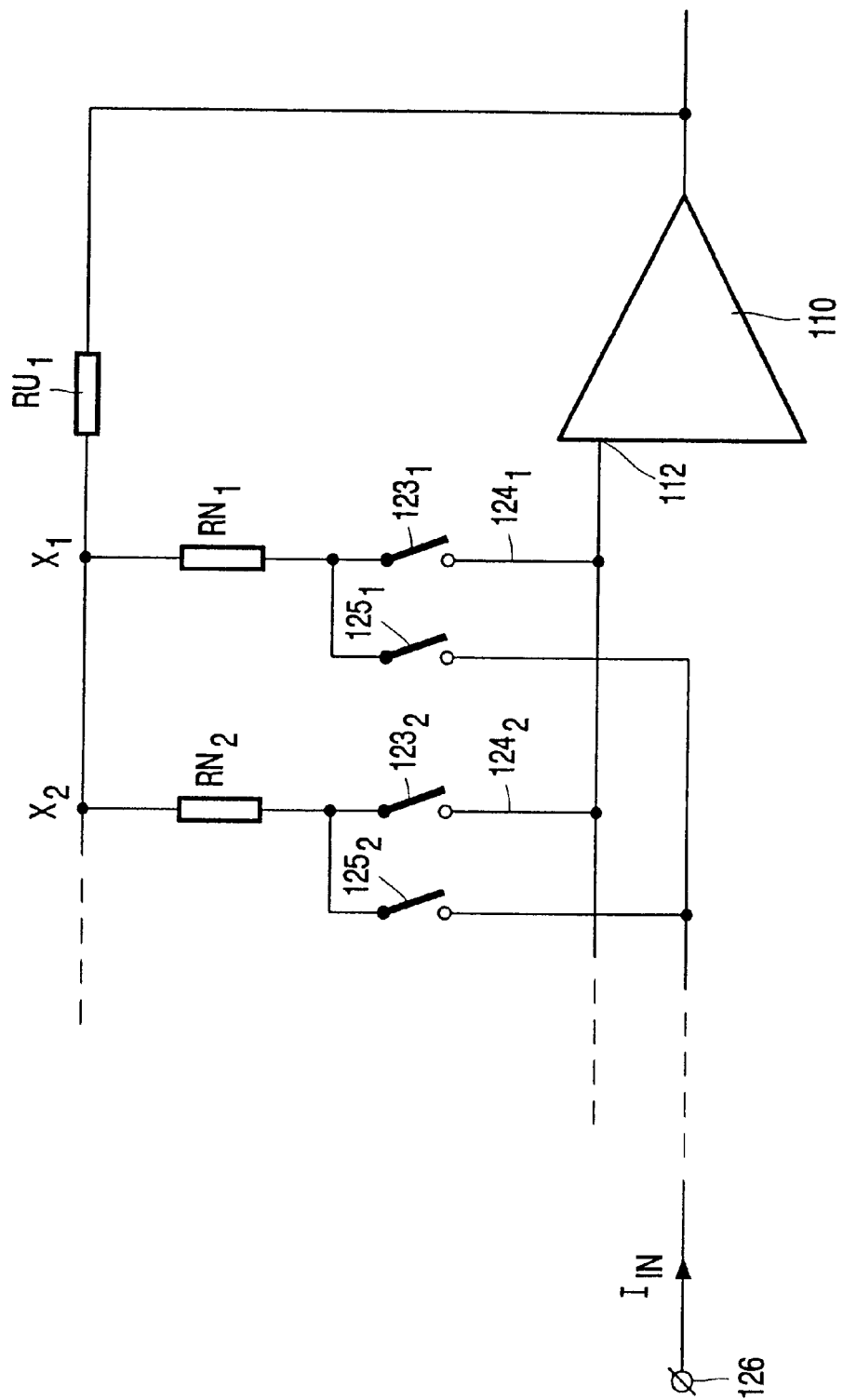
FIG. 6 is a circuit diagram illustrating an improved detail of the network of FIG. 5.

In the exemplary embodiment of FIG. 5, the current input of the IVC is connected directly to the inverting input 112 of the amplifier 110. This means that the input current $I_{in}$, when following a path through one of the branches 124 of the network 120, will pass through the corresponding switch 123, and a small voltage drop might develop over said switch, which would influence the functioning of the circuit. An improvement in this respect is proposed in FIG. 6, which shows only part of the ladder network 120. In this improvement, further selectable switches $125_i$ are associated with each of the selectable switches 123. More particularly, each further selectable switch $125_i$ has one terminal connected to that terminal of the corresponding selectable switch $123_i$ that is directed to the corresponding node $X_i$. The other terminals of the further selectable switches $125_i$ are connected to a current input terminal 126. The selectable switches 123 and the further selectable switches 125 are controlled in such a way, that corresponding switches $123_i$ and $125_i$ are always opened and closed simultaneously. Thus, a possible voltage drop over the selectable switch 125 that switches the current does not influence the corresponding feedback loop through the corresponding selectable feedback switch 123. The resistance of the selectable switch 125 causes only a (very small) voltage shift at the current input terminal 126, in the order of some millivolts, which has no consequence since the current is delivered by an almost ideal current source.

Summarizing, the present invention provides an IVC 100, comprising an operational amplifier 110 with an inverting input 112 and an output 113, and a feedback resistor ladder network 120 coupled between the output 113 and the inverting input 112. The feedback resistor ladder network 120 comprises a main chain 121 composed of a plurality of substantially identical unit resistors RU connected in series, and a plurality of branches $124_i$, each branch $124_i$ coupling a node $X_i$ in the main chain 121 to the inverting input 112 of the operational amplifier 110, each branch $124_i$ comprising a selectable feedback switch $123_i$. Further, some of the branches $124_i$ comprise a non-unit resistor $RNU_1$ coupled in series with the corresponding selectable feedback switch $123_i$.

Further, the present invention provides a circuit comprising a FIRDAC 20 and a bias block 30 for providing at least one bias current for the FIRDAC 20. The bias block 30 comprises at least one bias resistor RB. The FIRDAC 20 is associated with at least one IVC 25, 26, configured as described above, wherein the unit resistors RU of the at least one IVC 25, 26 are substantially identical to the bias resistor RB of the bias block 30.

It should be clear to a person skilled in the art that the scope of the present invention is not limited to the examples discussed in the above, but that several amendments and modifications are possible without departing from the scope of the invention as defined in the appending claims. For instance, in the embodiment as illustrated in FIG. 5, the non-unit resistors RNU might be connected between their corresponding selectable feedback switch 123 and the inverting input 112 of the amplifier 110.

Further, the embodiment of FIG. 5 is designed providing seven equal gain steps of approximately 3 dB. However, the number of steps may be larger or smaller than seven, while also the magnitude of the steps may be larger or smaller than 3 dB.

Further, in the embodiment of FIG. 5, N is taken to be equal to 6, but N may have a totally different value. In practice, it would be possible to take N relatively large and to take $R_{unit}$ relatively small, so that it would be possible to provide for a 3 dB node with a plurality of unit resistors exclusively, accepting some tolerance. However, this is rather unpractical, while further the accuracy decreases because the level of matching (i.e. the extent to which the individual resistors have identical resistance values) decreases due to a decreasing surface area vs circumference ratio.

What is claim is:

1. Current to voltage converter (100) with controllable gain, comprising:
    an operational amplifier (110) with an inverting input (112) and an output (113); and
    a feedback resistor ladder network (120) coupled between the output (113) and the inverting input (112) of the operational amplifier (110);
    wherein the feedback resistor ladder network (120) comprises a main chain (121) exclusively consisting of a plurality of substantially identical unit resistor means (RU) connected in series, and a plurality of branches ($124_i$), each branch ($124_i$) for coupling a node ($X_i$) in the main chain (121) to the inverting input (112) of the operational amplifier (110);
    wherein each branch ($124_i$) comprises a selectable feedback switch ($123_i$);
    wherein the main chain (121) is free from non-unit resistor means (RNU) and wherein non-unit resistor means (RNU), if any, are incorporated in branches (124) only.

2. Current to voltage converter according to claim 1, wherein at least one of the branches ($124_6$; $124_4$) is free from resistor means.

3. Current to voltage converter according to claim 1, wherein each branch ($124_i$) comprises a maximum of one non-unit resistor means (RNU).

4. Current to voltage converter according to claim 1, wherein the resistance values of the non-unit resistor means are less than the resistance value of the unit resistor means (RU).

5. Current to voltage converter according to claim 1, wherein each branch (124) defines a feedback path from the output (113) of the amplifier (110) to the inverting input (112) of the amplifier (110), and wherein neighboring branches have a constant resistance ratio of, for instance, approximately $\sqrt{2}$.

6. Current to voltage converter according to claim 1, wherein the number of unit resistor means (RU) in that part of the main chain (121) between the output (113) of the amplifier (110) a 0 dB node ($X_6$) is even, and preferably equals 6 or 8.

7. Current to voltage converter according to claim 1, wherein the non-unit resistor means ($RNU_2$) in at least one of the branches (124$_2$) comprises a parallel connection of two unit resistor means.

8. Current to voltage converter according to claim 1, wherein the feedback resistor ladder network (120) comprises:

a main chain (121) with seven nodes (X$_1$–X$_7$);

a first unit resistor means (RU$_1$) coupled between the output (113) of the amplifier (110) and the first node (X$_1$);

a second unit resistor means (RU$_2$) coupled between the second node (X$_2$) and the third node (X$_3$);

a third unit resistor means (RU$_3$) coupled between the third node (X$_3$) and the fourth node (X$_4$);

a fourth unit resistor means (RU$_4$) coupled between the fourth node (X$_4$) and the fifth node (X$_5$);

a fifth unit resistor means (RU$_5$) and a sixth unit resistor means (RU$_6$) coupled in series between the fifth node (X$_5$) and the sixth node (X$_6$);

a seventh unit resistor means (RU$_7$) and an eighth unit resistor means (RU$_8$) coupled in series between the sixth node (X$_6$) and the seventh node (X$_7$);

a first non-unit resistor means (RNU$_1$) coupled between the first node (X$_1$) and a first selectable switch (123$_1$) of a first branch (124$_1$);

a second non-unit resistor means (RNU$_2$) coupled between the second node (X$_2$) and a second selectable switch (123$_2$) of a second branch (124$_2$);

a third non-unit resistor means (RNU$_3$) coupled between the third node (X$_3$) and a third selectable switch (123$_3$) of a third branch (124$_3$);

a fourth non-unit resistor means (RNU$_4$) coupled between the fifth node (X$_5$) and a fifth selectable switch (123$_5$) of a fifth branch (124$_5$);

a fifth non-unit resistor means (RNU$_5$) coupled between the seventh node (X$_7$) and a seventh selectable switch (123$_7$) of a seventh branch (124$_7$);

the first and the second nodes (X1, X2) being connected together;

a fourth switch (123$_4$) of a fourth branch (124$_4$) being connected directly to the fourth node (X$_4$);

a sixth switch (123$_6$) of a sixth branch (124$_6$) being connected directly to the sixth node (X$_6$);

all of said selectable switches being connected in common to the inverting input (112) of the amplifier (110).

9. Current to voltage converter according to claim 1, further comprising a current input terminal (126) for receiving a current input signal (I$_{in}$), wherein said current input terminal (126), through corresponding selectable current switches (125), is coupled to that terminal of each selectable feedback switch (123) that is directed towards the corresponding node (X) in the main chain (121).

10. Signal processing circuit, comprising at least one bias circuit (30) and at least one current to voltage converter (25; 26) with controllable gain, comprising:

an operational amplifier (110) with an inverting input (112) and an output (113); and a feedback resistor ladder network (120) coupled between the output (113) and the inverting input (112) of the operational amplifier (110);

wherein the feedback resistor ladder network (120) comprises a main chain (121) exclusively consisting of a plurality of substantially identical unit resistor means (RU) connected in series, and a plurality of branches (124$_i$), each branch (124$_i$) for coupling a node (X$_i$) in the main chain (121) to the inverting input (112) of the operational amplifier (110);

wherein each branch (124$_i$) comprises a selectable feedback switch (123$_i$);

wherein the main chain (121) is free from non-unit resistor means (RNU) and wherein non-unit resistor means (RNU), if any, are incorporated in branches (124) only, wherein said bias circuit (30) comprises a bias resistor means (RB), the bias resistor means (RB) being composed of one or more resistor means, for instance coupled in series, each of these resistor means having a resistance value equal to the resistance value of the unit resistor means (RU).

11. Signal processing circuit according to claim 10, comprising a FIRDAC (20) coupled to said bias circuit (30), the FIRDAC (20) comprising at least one current output (23; 24) coupled to a current input terminal of a corresponding current to voltage converter (25; 26).

12. Signal processing circuit according to claim 10, wherein the at least one current to voltage converter (25; 26) and the bias circuit (30), and preferably also the FIRDAC (20), are formed as one common integrated circuit in one chip.

* * * * *